(12) United States Patent
Velez et al.

(10) Patent No.: US 10,074,625 B2
(45) Date of Patent: Sep. 11, 2018

(54) WAFER LEVEL PACKAGE (WLP) BALL SUPPORT USING CAVITY STRUCTURE

(71) Applicant: QUALCOMM Incorporated, San Diego, CA (US)

(72) Inventors: Mario Francisco Velez, San Diego, CA (US); David Francis Berdy, San Diego, CA (US); Changhan Hobie Yun, San Diego, CA (US); Jonghae Kim, San Diego, CA (US); Chengjie Zuo, Santee, CA (US); Daeik Daniel Kim, Del Mar, CA (US); Je-Hsiung Jeffrey Lan, San Diego, CA (US); Niranjan Sunil Mudakatte, San Diego, CA (US); Robert Paul Mikulka, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/859,323

(22) Filed: Sep. 20, 2015

(65) Prior Publication Data
US 2017/0084565 A1 Mar. 23, 2017

(51) Int. Cl.
*H01L 23/00* (2006.01)
*H01L 23/13* (2006.01)
*H01L 23/498* (2006.01)

(52) U.S. Cl.
CPC .............. *H01L 24/17* (2013.01); *H01L 23/13* (2013.01); *H01L 23/49816* (2013.01); *H01L 24/03* (2013.01); *H01L 24/09* (2013.01); *H01L 24/11* (2013.01); *H01L 2224/023* (2013.01); *H01L 2224/0905* (2013.01)

(58) Field of Classification Search
CPC ......... H01L 24/06; H01L 24/09; H01L 24/14; H01L 24/17; H01L 2224/023; H01L 2224/02333; H01L 2224/02335; H01L 2224/0236; H01L 2224/0901; H01L 2224/0905; H01L 2224/09055
See application file for complete search history.

(56) References Cited

U.S. PATENT DOCUMENTS

| | | | | |
|---|---|---|---|---|
| 6,559,390 | B1 * | 5/2003 | Tanaka | H01L 21/563 174/260 |
| 6,573,598 | B2 * | 6/2003 | Ohuchi | H01L 21/78 257/734 |
| 6,818,545 | B2 * | 11/2004 | Lee | H01L 24/05 257/E21.508 |
| 6,854,633 | B1 * | 2/2005 | Grigg | B23K 1/203 228/207 |
| 6,897,142 | B2 * | 5/2005 | Fujimori | H01L 21/563 257/E21.503 |

(Continued)

FOREIGN PATENT DOCUMENTS

GB 2389460 A 12/2003

OTHER PUBLICATIONS

International Search Report and Written Opinion—PCT/US2016/052631—ISA/EPO—Nov. 23, 2016.

*Primary Examiner* — David Zarneke
(74) *Attorney, Agent, or Firm* — Muncy, Geissler, Olds & Lowe, P.C.

(57) ABSTRACT

An integrated circuit device in a wafer level package (WLP) includes ball grid array (BGA) balls fabricated with cavities filled with adhesives for improved solder joint reliability.

18 Claims, 4 Drawing Sheets

(56) References Cited

U.S. PATENT DOCUMENTS

| | | | |
|---|---|---|---|
| 9,484,318 B2* | 11/2016 | Shao | H01L 24/14 |
| 9,754,847 B2* | 9/2017 | Wang | H01L 22/32 |
| 2002/0070440 A1* | 6/2002 | Aiba | H01L 23/3107 |
| | | | 257/690 |
| 2002/0167085 A1* | 11/2002 | Ohuchi | H01L 21/78 |
| | | | 257/750 |
| 2002/0175409 A1* | 11/2002 | Tsubosaki | H01L 23/485 |
| | | | 257/737 |
| 2003/0121698 A1 | 7/2003 | Kyougoku et al. | |
| 2004/0165362 A1 | 8/2004 | Farnworth | |
| 2009/0032960 A1* | 2/2009 | Pratt | H01L 21/76898 |
| | | | 257/773 |
| 2010/0319974 A1* | 12/2010 | Ishizuka | H01L 24/16 |
| | | | 174/260 |
| 2012/0248624 A1* | 10/2012 | Endo | H01L 21/76898 |
| | | | 257/774 |
| 2013/0026649 A1* | 1/2013 | Takenaka | H01L 25/0657 |
| | | | 257/774 |
| 2013/0037939 A1* | 2/2013 | Lee | H01L 23/481 |
| | | | 257/737 |
| 2013/0077275 A1* | 3/2013 | Kariyazaki | H01L 23/49838 |
| | | | 361/783 |
| 2013/0154112 A1* | 6/2013 | Zhang | H01L 23/3178 |
| | | | 257/774 |
| 2014/0070423 A1 | 3/2014 | Woychik et al. | |
| 2014/0166194 A1* | 6/2014 | Hu | H01L 24/11 |
| | | | 156/212 |
| 2014/0167254 A1* | 6/2014 | Yu | H01L 24/11 |
| | | | 257/737 |
| 2014/0327150 A1* | 11/2014 | Jung | H01L 24/96 |
| | | | 257/774 |
| 2015/0237732 A1 | 8/2015 | Velez et al. | |

* cited by examiner

WAFER LEVEL PACKAGE (WLP) BALL SUPPORT USING CAVITY STRUCTURE

FIELD OF DISCLOSURE

Various examples described herein relate to integrated circuit devices, and more particularly, to integrated circuit devices with wafer level package (WLP) ball support.

BACKGROUND

Integrated passive devices (IPDs) with analog components such as capacitors or inductors are being implemented in electronic products with small form factors. It is desirable that integrated passive devices (IPDs) be fabricated in integrated circuit packages with small footprints, for example, wafer level packages (WLPs). An IPD may have a significant portion of the package area tends to be dominated by large inductors which reduce the area available for ball grid array (BGA) balls in a WLP. Due to the relatively small area available for BGA balls in a WLP, the BGA balls near the die pad or under-bump metallization (UBM) area of the WLP may exhibit mechanical weaknesses, thereby adversely affecting the solder joint reliability of the BGA balls. Therefore, there is a need to improve the solder joint reliability of the BGA balls in a WLP, especially where the area of the package available for the BGA balls is small relative to the total package area.

SUMMARY

Examples of the disclosure are directed to integrated circuit devices and methods of making the same.

In an example, an integrated circuit device is provided, the integrated circuit device comprising: a package; a dielectric layer having first and second surfaces, the first surface of the dielectric layer disposed on the package, the dielectric layer having a plurality of cavities recessed from the second surface of the dielectric layer; a plurality of conductive pads disposed within the dielectric layer; a plurality of conductors disposed on the conductive pads, the conductors separated from the dielectric layer at least in part by the cavities, respectively; and an adhesive disposed in the cavities.

In another example, an integrated passive device is provided, the integrated passive device comprising: a package; a dielectric layer having first and second surfaces, the first surface of the dielectric layer disposed on the package, the dielectric layer having a plurality of cavities recessed from the second surface of the dielectric layer; a plurality of conductive pads disposed within the dielectric layer, the pads comprising a plurality of stacked redistribution layers (RDLs); a plurality of conductors disposed on the conductive pads, the conductors separated from the dielectric layer at least in part by the cavities, respectively; and an adhesive disposed in the cavities.

In yet another example, a method of making an integrated circuit device is provided, the method comprising: providing a package; forming a dielectric layer having a first surface disposed on the package and a second surface opposite the first surface; forming a plurality of cavities recessed from the second surface of the dielectric layer; forming a plurality of conductive pads within the dielectric layer; forming a plurality of conductors on the conductive pads; and providing an adhesive in the cavities.

BRIEF DESCRIPTION OF THE DRAWINGS

The accompanying drawings are presented to aid in the description of examples of the disclosure and are provided solely for illustration of the examples and not limitation thereof.

DETAILED DESCRIPTION

Aspects of the disclosure are described in the following description and related drawings directed to specific examples. Alternate examples may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any example described herein as "exemplary" is not necessarily to be construed as preferred or advantageous over other examples. Likewise, the term "examples" does not require that all examples include the discussed feature, advantage or mode of operation.

The terminology used herein is for the purpose of describing particular examples only and is not intended to be limiting of the examples. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, s, operations, elements, and/or components, but do not preclude the presence or addition of one or more other features, integers, s, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Figure 1:
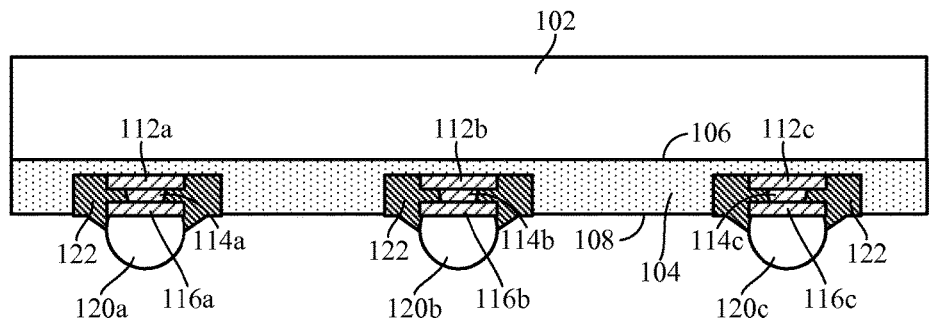
FIG. 1 is a sectional view of an example of an integrated circuit device.

FIG. 1 is a sectional view of an example of an integrated circuit device. In the example shown in FIG. 1, a dielectric layer 104 is provided on a package 102. The dielectric 104 has a first surface 106 which is in direct contact with the package 102 and a second surface 108 opposite the first surface 106. An adhesive 122 is provided within the dielectric layer 104. One or more layers of conductive pads, for example, two layers of conductive pads 112a-c and 116a-c connected by conductive vias 114a-c, respectively, as shown in FIG. 1, are provided within the dielectric layer 104 and are at least partially surrounded by the adhesive 122.

The outermost layer of the conductive pads (e.g., 116a-c) may only be partially within the recess or cavity. In other words, the outermost layer of the conductive pads (e.g., 116a-c) may have a surface that is exposed in order to electrically connect that surface to another conductor. In this example, the sidewalls of the conductive pads 112a, 112b, 112c, 114a, 114b, 114c, 116a, 116b and 116c are in direct contact with the adhesive 122. Alternatively, a single layer, two layers, or three or more layers of conductive pads may be provided. In an example, a plurality of conductors 120a, 120b and 120c are provided on the conductive pads 116a, 116b and 116c, respectively.

Figure 3:
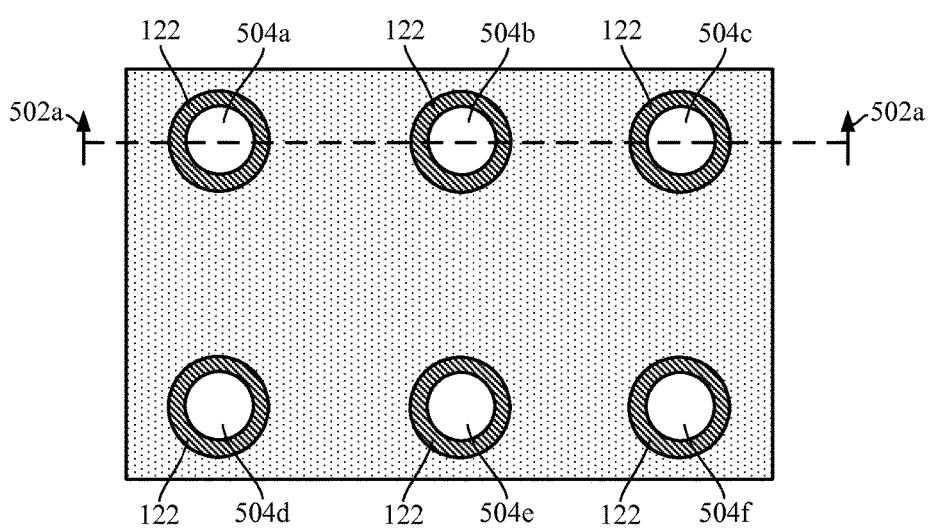
FIG. 3 is a bottom plan view of the integrated circuit device of FIG. 1 or 2.

In an example, the package 102 may be a package or another type of device using interposer technology that utilizes ball grid array (BGA) balls such as wafer level packaging (WLP). In an example, the dielectric layer 104 may be a passivation layer, such as a polyimide (PI) layer, to protect the conductive pads from chemical reactions with outside elements. In an example, the conductive pads 112a, 112b, 112c, 114a, 114b, 114c, 116a, 116b and 116c may be provided as two redistribution layers (RDLs) and a via connecting the two RDLs, for example. In an example, the conductors 120a, 120b and 120c may be metal balls such as BGA balls or pillars, such as copper pillars, for example. A bottom plan view of the integrated circuit device in the example illustrated in FIG. 1 is shown in FIG. 3, which will be described in further detail below. An example of processes for making the integrated circuit device of FIG. 1 will be described in further detail below with respect to FIGS. 4A-D.

Figure 2:
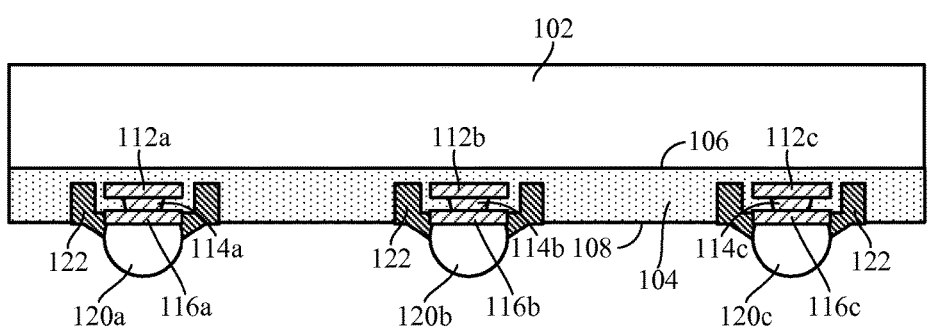
FIG. 2 is a sectional view of another example of an integrated circuit device.

FIG. 2 is a sectional view of an alternate example of the integrated circuit device. Like the example shown in FIG. 1, the example illustrated in FIG. 2 includes a dielectric layer 104 having a first surface 106 in direct contact with a package 102 and a second surface 108 opposite the first surface 106. One or more layers of conductive pads, for example, two layers of conductive pads 112a-c and 116a-c connected by conductive vias 114a-c, respectively, as shown in FIG. 2, are provided within the dielectric layer 104 and are at least partially surrounded by the adhesive 122. In the alternate example shown in FIG. 2, the sidewalls of the conductive pads 112a-c and 116a-c and the conductive vias 114a-c are surrounded by the dielectric layer 104 instead of the adhesive 122 as shown in FIG. 1. In FIG. 2, an adhesive 122 are provided within the dielectric layer 104. The adhesive 122 may be provided within doughnut-shaped recesses or cavities within the dielectric layer 104 surrounding the conductive pads 112a-c, 116b-c, and the conductive vias 114a-c, a bottom plan view of which is shown in FIG. 3. Alternatively, instead of circular doughnut shaped cavities in which the adhesive 122 is provided, such cavities may be shaped as rectangles, hexagons, octagons, or other polygons.

The outermost layer of the conductive pads (e.g., 116a-c) may only be partially within the recess or cavity. In other words, the outermost layer of the conductive pads (e.g., 116a-c) may have a surface that is exposed in order to electrically connect that surface to another conductor. In the example shown in FIG. 2, the sidewalls of the conductive pads 112a, 112b, 112c, 114a, 114b, 114c, 116a, 116b and 116c are in direct contact with the dielectric layer 104. Alternatively, a single layer, two layers, or three or more layers of conductive pads may be provided. In an example, a plurality of conductors 120a, 120b and 120c are provided on the conductive pads 116a, 116b and 116c, respectively.

In an example, the package 102 as shown in FIG. 2 may be a package or another type of device using interposer technology that utilizes BGA balls such as WLP. In an example, the dielectric layer 104 may be a passivation layer, such as a PI layer, to protect the conductive pads from chemical reactions with outside elements. In an example, the conductive pads 112a, 112b, 112c, 114a, 114b, 114c, 116a, 116b and 116c may be formed by two RDLs and a via connecting the two RDLs, for example. In an example, the conductors 120a, 120b and 120c may be metal balls such as BGA balls or pillars, such as copper pillars, for example. A bottom plan view of the integrated circuit device in the example illustrated in FIG. 2 is shown in FIG. 3, which will be described in further detail below. An example of processes for making the integrated circuit device of FIG. 2 will be described in further detail below with respect to FIGS. 5A-C.

FIG. 3 is a bottom plan view which applies to both examples of the integrated circuit devices of FIGS. 1 and 2. In other words, FIGS. 1 and 2 may be regarded as sectional views taken along sectional line 302a-302b of FIG. 3, for example. Referring to FIG. 3, which shows a portion of a bottom plan view of an integrated circuit device, a plurality of conductors 304a, 304b, . . . 304f are provided in an array of three columns and two rows. In this bottom plan view, the adhesive 122 separates each of the conductors 304a, 304b, . . . 304f from the dielectric layer 104 of the WLP. In an example, the conductors 304a, 304b, . . . 304f comprise BGA balls. Alternatively, the conductors 304a, 304b, . . . 304f may comprise other types of conductors for providing electrical connections, for example, pillars such as copper pillars.

The adhesive 122 may comprise a resin. Alternatively, the adhesive 122 may comprise a silicone, an epoxy, a room temperature vulcanization (RTV) material, or a thermoplastic. The dielectric layer 104 may comprise a passivation layer, such as a PI layer. In the two examples as shown in the sectional views of FIGS. 1 and 2, some of the adhesive 122 cover portions of the conductors 120a, 120b and 120c to provide further support for the conductors 120a, 120b and 120c. In FIG. 3, the adhesive 122 is shown as surrounding each of the conductors 304a, 304b, . . . 304f in the bottom plan view. In the structure as shown in FIG. 3, the adhesive 122 provides mechanical support for the conductors 304a, 304b, . . . 304f. In the example in which the conductors 304a, 304b, . . . 304f comprise BGA balls, which function as solder joints for electrical connections to a printed circuit board (PCB), for example, mechanical reliability of the solder joints may be improved by the mechanical support provided by the adhesive 122 surrounding the conductors 304a, 304b, . . . 304f.

Figure 4A:
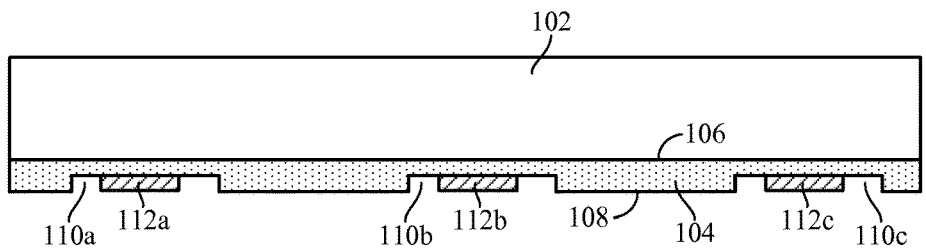
FIG. 4A is a sectional view illustrating an example of a first process in the manufacturing of the example of the integrated circuit device as shown in FIG. 1.

FIG. 4A is a sectional view illustrating an example of a first process in the manufacturing of the example of the integrated circuit device shown in FIG. 1. In FIG. 4A, a package 102 is provided, and a dielectric layer 104 having a first surface 106 and a second surface 108 is provided on the package 102. In the example shown in FIG. 4A, the first surface 106 of the dielectric layer 104 is in direct contact with the package 102. The package 102 may comprise silicon or another type of material suitable for wafer level packaging (WLP). In an example, the dielectric layer 104 comprises a dielectric material such as a polyimide (PI) dielectric. Other types of dielectric materials may also be implemented for the dielectric layer 104 in alternate examples. In an example, the dielectric layer 104 may be implemented to function also as a passivation layer that protects metal layers from chemically reacting with outside elements.

In the example shown in FIG. 4A, which illustrates the first process of manufacturing an example of an integrated circuit device, a plurality of cavities 110a, 110b and 110c are provided which are recessed from the second surface 108 of the dielectric layer 104. The cavities may be formed through patterning and etching the dielectric layer 104, which may comprise one or more passivation materials. Alternatively, the cavities 110a, 110b and 110c may be formed by using other processes, for example, by laser ablation.

Figure 4B:
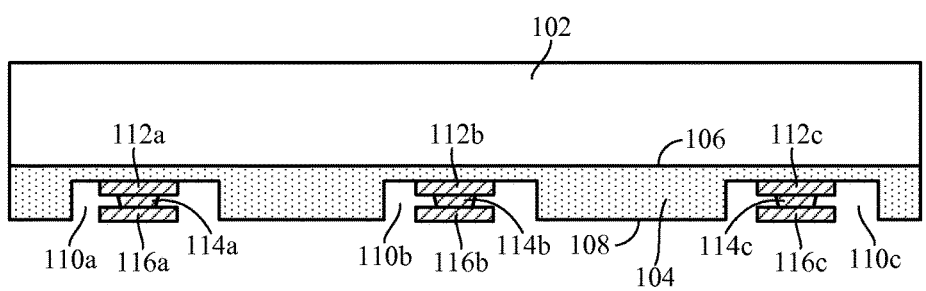
FIG. 4B is a sectional view illustrating an example of a second process in the manufacturing of the example of the integrated circuit device as shown in FIG. 1.

In an example, a first plurality of conductive pads 112a, 112b and 112c are provided within the cavities 110a, 110b and 110c of the dielectric layer 104, respectively. In the example shown in FIG. 1A, the first plurality of conductive pads 112a, 112b and 112c are provided as a first layer of conductive pads. One or more additional layers of conductive pads also may be provided within the cavities 110a, 110b and 110c as shown in FIG. 4B. In an example, the conductive pads 112a, 112b and 112c are provided as a redistribution layer (RDL). The RDL may be formed on a dielectric layer, for example, a dielectric layer made of a PI material, in a WLP in a manner known to persons skilled in the art.

FIG. 4B is a sectional view illustrating an example of a second process in the manufacturing of the example of the integrated circuit device of FIG. 4A. In the example illustrated in FIG. 4B, a plurality of conductive vias 114a, 114b and 114c are provided on the first layer of conductive pads 112a, 112b and 112c, respectively. Moreover, another plurality of conductive pads 116a, 116b and 116c are provided as another layer of conductive pads on the conductive vias 114a, 114b and 114c, respectively. In this example, the conductive pads 112a-c and the conductive pads 116a-c are provided as two separate RDLs, and the conductive vias 114a-c are provided to connect the conductive pads 112a-c and 116a-c, respectively. In alternate examples, the conductive pads in each of the cavities may be formed by a single layer, two layers, or three or more layers in various manners known to persons skilled in the art.

Figure 4C:
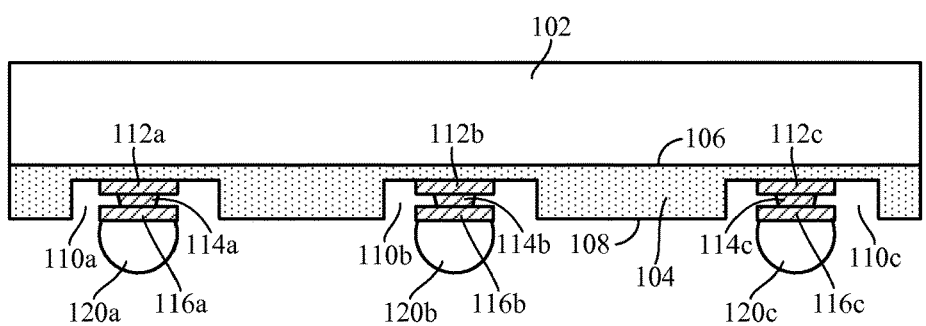
FIG. 4C is a sectional view illustrating an example of a third process in the manufacturing of the example of the integrated circuit device as shown in FIG. 1.

FIG. 4C is a sectional view illustrating an example of a third process in the manufacturing of the example of the integrated circuit device of FIGS. 4A-4B. A plurality of conductors 120a, 120b and 120c are provided on the conductive pads 116a, 116b and 116c, respectively. In an example, the conductive pads 116a, 116b and 116c in the third layer are ball pads in direct contact with and supported by the conductors 120a, 120b and 120c, respectively. In an example, the conductors 120a, 120b and 120c are metal balls, such as ball grid array (BGA) balls in a WLP or copper pillars, for example.

Figure 4D:
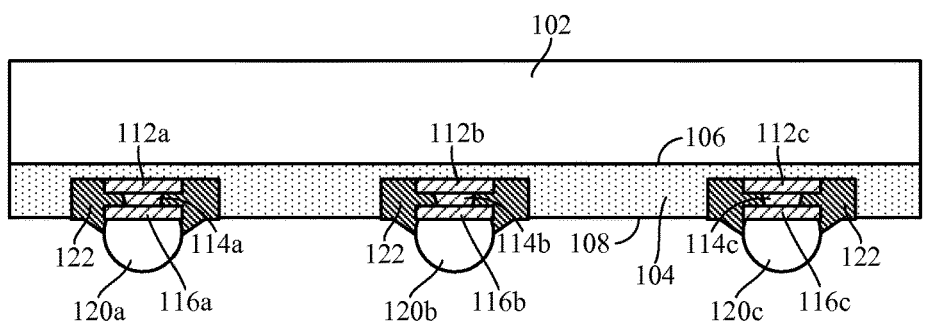
FIG. 4D is a sectional view illustrating an example of a fourth process in the manufacturing of the example of the integrated circuit device as shown in FIG. 1.

FIG. 4D is a sectional view illustrating an example of a fourth process in the manufacturing of the example of the integrated circuit device of FIGS. 4A-4C. An adhesive 122 is provided within each of the cavities 110a, 110b and 110c in FIGS. 4A-4C. In the example shown in FIG. 4D, the adhesive 122 fills each of the cavities 110a, 110b and 110c, such that the sidewalls of the conductive pads 112a, 112b, 112c, 114a, 114b, 114c, 116a, 116b and 116c are in direct contact with the adhesive 122 within each of the cavities 110a, 110b and 110c. In the example shown in FIG. 1D, the conductors 120a, 120b and 120c are not in direct with the dielectric layer 104. In an example, the adhesive 122 comprises of a resin material. Alternatively, other types of adhesives may also be used, including, for example, silicones, epoxies, RTV materials, or thermoplastics. As shown in FIG. 4D, some of the adhesive 122 may cover portions of the conductors 120a, 120b and 120c near the bottom layer of conductive pads 116a, 116b and 116c, respectively, to provide further support for the conductors 120a, 120b and 120c.

Figure 5A:
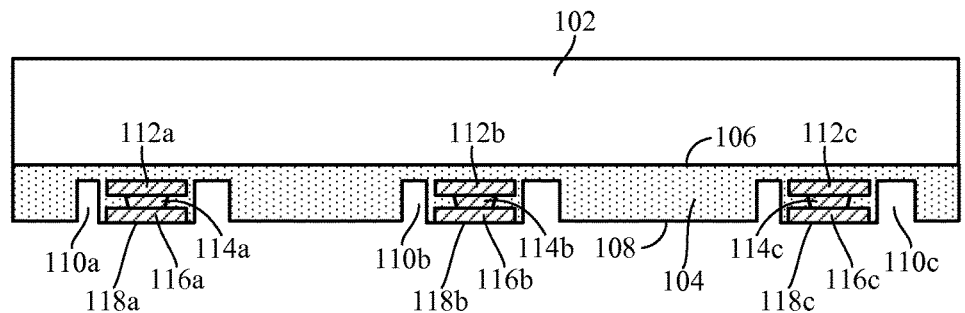
FIG. 5A is a sectional view illustrating an example of a first process in the manufacturing of the example of the integrated circuit device as shown in FIG. 2.

FIG. 5A is a sectional view illustrating an example of a first process in the manufacturing of the alternate example of the integrated circuit device as shown in FIG. 2. In FIG. 5A, a package 102 is provided, and a dielectric layer 104 having a first surface 106 and a second surface 108 is provided on the package 102 in a manner similar to FIG. 4A described above. In the example shown in FIG. 5A, the first surface 106 of the dielectric layer 104 is in direct contact with the package 102. The package 102 may comprise silicon or another type of material suitable for WLP. The dielectric layer 104 may comprise a dielectric material such as a PI dielectric, or alternatively, another type of dielectric material suitable for WLP. In an example, the dielectric layer 104 may also function as a passivation layer that protects metal layers from chemically reacting with outside elements.

In FIG. 5A, a first plurality of conductive pads 112a, 112b and 112c are provided as a first layer of conductive pads. In an example, the conductive pads 112a, 112b and 112c are provided as a redistribution layer (RDL). The RDL may be formed on a dielectric layer, for example, a dielectric layer made of a PI material, in a WLP in a manner known to persons skilled in the art. In the example shown in FIG. 5A, a plurality of conductive vias 114a, 114b and 114c are provided on the first layer of conductive pads 112a, 112b and 112c, respectively. Moreover, another plurality of conductive pads 116a, 116b and 116c are provided as another layer of conductive pads on the conductive vias 114a, 114b and 114c, respectively.

In this example, the conductive pads 112a-c and the conductive pads 116a-c are provided as two separate RDLs, and the conductive vias 114a-c are provided to connect the conductive pads 112a-c and 116a-c, respectively. In alternate examples, the conductive pads in each of the cavities may be formed by a single layer, two layers, or three or more layers in various manners known to persons skilled in the art. The outermost layer of the conductive pads (e.g., 116a-c) may have a surface that is exposed in order to electrically connect that surface to another conductor. In the example shown in FIG. 5A, the two layers of conductive pads 112a-c, 116a-c, and the conductive vias 114a-c connecting the two layers of conductive pads have sidewalls in direct contact with the dielectric 104. In an example, a plurality of conductors 120a, 120b and 120c are provided on the conductive pads 116a, 116b and 116c, respectively.

In the example shown in FIG. 5A, a plurality of cavities 110a, 110b and 110c are provided as doughnut-shaped cavities surrounding the dielectric 104 in which the layers of conductive pads 112a-c and 116a-c and the conductive vias 114a-c are positioned. The doughnut-shaped cavities 110a, 110b and 110c may be provided as circular doughnut-shaped cavities. Alternatively, other shapes of cavities, for example, rectangles, hexagons, octagons, or other polygons, may be provided to surround the dielectric 104 in which the conductive pads 112*a-c* and 116*a-c* and the conductive vias 114*a-c* are positioned. The cavities may be formed through patterning and etching the dielectric layer 104, which may comprise one or more passivation materials. Alternatively, the cavities 110*a*, 110*b* and 110*c* may be formed by using other processes, for example, by laser ablation.

Figure 5B:
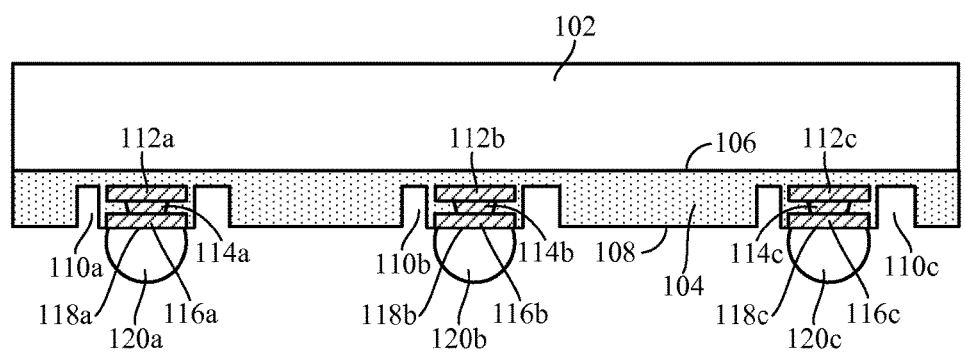
FIG. 5B is a sectional view illustrating an example of a second process in the manufacturing of the example of the integrated circuit device as shown in FIG. 2.

FIG. 5B is a sectional view illustrating an example of a second process in the manufacturing of the example of the integrated circuit device of FIG. 5A. In the example illustrated in FIG. 5B, a plurality of conductors 120*a*, 120*b* and 120*c* are provided on the bottom surfaces 118*a*, 118*b* and 118*c* of the bottom layer of conductive pads 116*a*, 116*b* and 116*c*, respectively. In the example shown in FIG. 5B, however, the sidewalls of the layers of conductive pads 112*a-c*, 116*a-c* and the conductive vias 114*a-c* are not exposed to the cavities 110*a-c*, and all or at least a majority of the bottom surfaces 118*a*, 118*b* and 118*c* of the conductive pads 116*a*, 116*b* and 116*c* are covered by the conductors 120*a*, 120*b* and 120*c*, respectively. In an example, the conductors 120*a*, 120*b* and 120*c* are metal balls, such as ball grid array (BGA) balls in a WLP, for example.

Figure 5C:
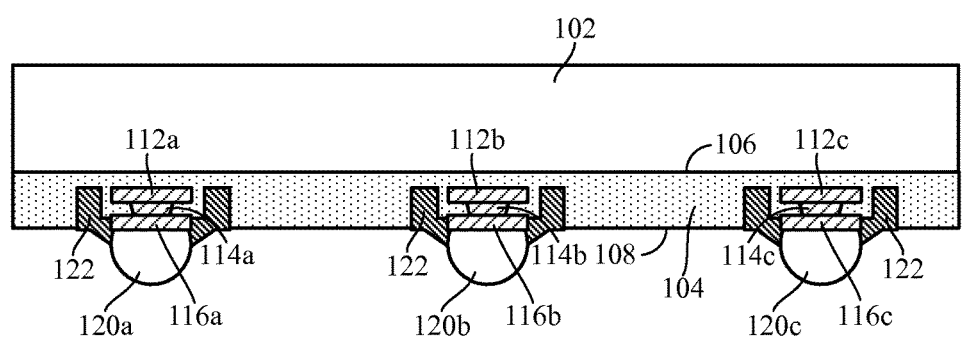
FIG. 5C is a sectional view illustrating an example of a third process in the manufacturing of the example of the integrated circuit device as shown in FIG. 2.

FIG. 5C is a sectional view illustrating an example of a third process in the manufacturing of the example of the integrated circuit device of FIGS. 5A-5B. In the example illustrated in FIG. 5C, an adhesive 122 is provided within each of the cavities 110*a*, 110*b* and 110*c*. In this example, the adhesive 122 completely fills each of the cavities 110*a*, 110*b* and 110*c* within the dielectric layer 104. In this example, the dielectric layer 104, not the adhesive 122, are in direct contact with the sidewalls of the layers of conductive pads 112*a-c*, 116*a-c* and the conductive vias 114*a-c*. The adhesive 122 may comprise resin or another type of adhesive material, for example, silicones, epoxies, RTV materials, or thermoplastics. Again, some of the adhesive 122 may cover portions of the conductors 120*a*, 120*b* and 120*c* near the bottom layer of conductive pads 116*a*, 116*b* and 116*c*, respectively, to provide mechanical support for the conductors 120*a*, 120*b* and 120*c*.

Figure 6:
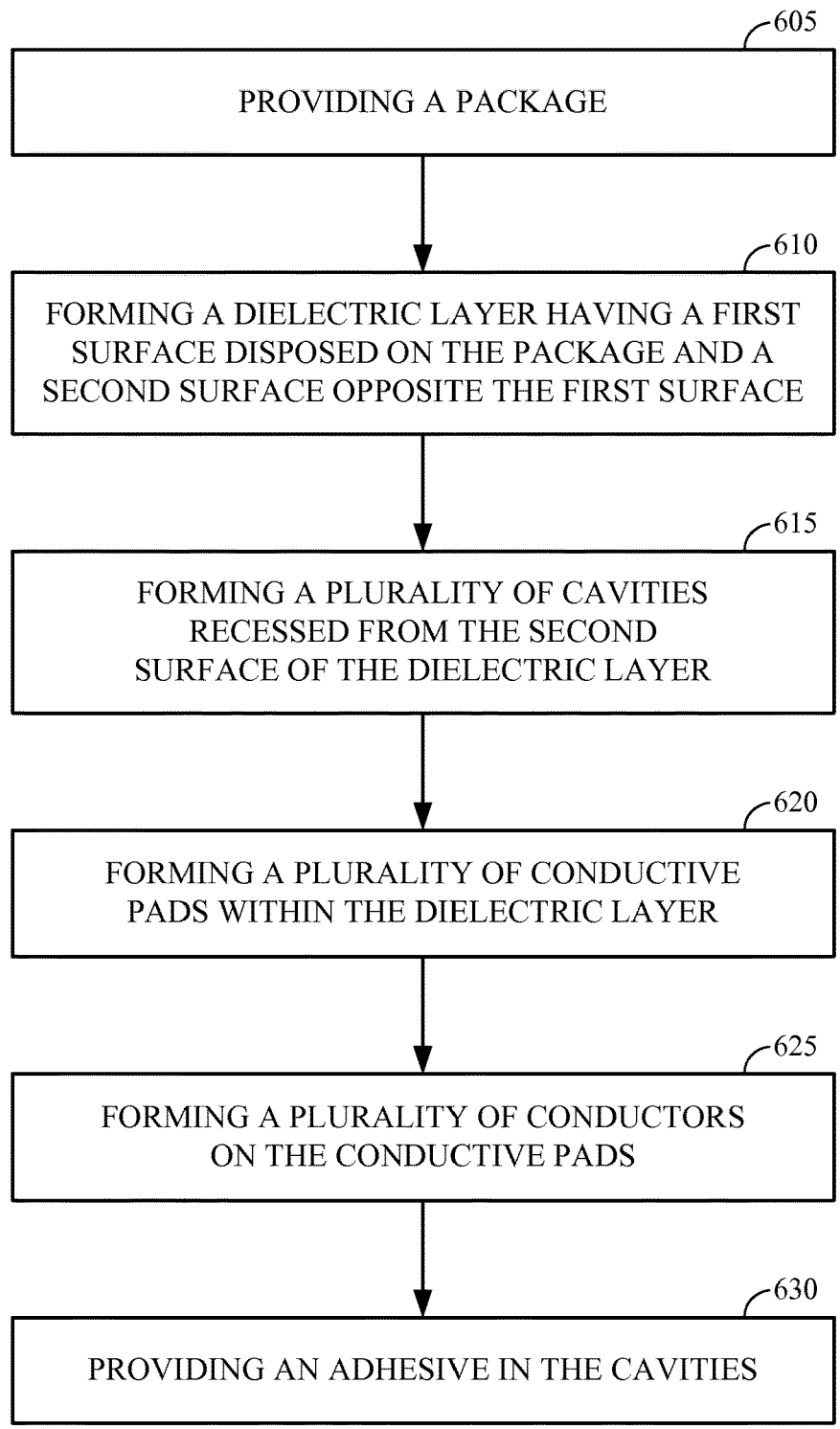
FIG. 6 is a flowchart illustrating an example of a method of making an integrated circuit device.

FIG. 6 is a flowchart illustrating an example of a method of making an integrated circuit device. Referring to FIG. 6, a package is provided in block 605, and a dielectric layer having a first surface disposed on the package and a second surface opposite the first surface is formed in block 610. In block 615, a plurality of cavities recessed from the second surface of the dielectric layer is formed, and in block 620, a plurality of conductive pads are formed within the dielectric layer. In block 625, a plurality of conductors are formed on the conductive pads. In block 630, an adhesive is provided in the cavities.

In an example, the conductive pads are formed within the dielectric layer by using an under-bump metallization (UBM) process, for example. The UBM process is a flip-chip process for bumping integrated circuit (IC) bond pads, which may be made of a metal such as aluminum, which may not have a readily solderable surface, as it is not easily bondable by most solders. The UBM process provides conductive pads over the IC bond pads to provide strong, stable, and low-resistance electrical connections to the IC bond pads and to protect the metal such as aluminum on the IC bond pads from exposure to the external environment. The conductive pads formed by the UBM process, for example, the outermost layer of conductive pads 116*a-c* in the examples shown in FIGS. 1 and 2 described above, may be easily bondable for solder reflow. In other words, the outermost layer of conductive pads 116*a-c* may have surfaces readily solderable by the conductors 120*a-c*, which may comprise BGA balls, for example. Metal processes other than UBM may also be used for forming the conductive pads in manners known to persons skilled in the art.

While the foregoing disclosure shows illustrative examples, it should be noted that various changes and modifications could be made herein without departing from the scope of the appended claims. The functions, s or actions of the method claims in accordance with examples described herein need not be performed in any particular order unless expressly stated otherwise. Furthermore, although elements may be described or claimed in the singular, the plural is contemplated unless limitation to the singular is explicitly stated.

What is claimed is:

1. A device, comprising:
a package;
a dielectric layer having first and second surfaces, the first surface of the dielectric layer disposed on the package, the dielectric layer comprising a plurality of cavities recessed from the second surface of the dielectric layer and not extending to the first surface of the dielectric layer, each of the plurality of cavities having a bottom surface formed by the dielectric layer;
an adhesive in the plurality of cavities;
a plurality of conductive pads within the plurality of cavities, each of the plurality of conductive pads positioned on the bottom surface of a respective one of the plurality of cavities and separated from the package by the dielectric layer; and
a plurality of conductors on the plurality of conductive pads, the plurality of conductors separated from the dielectric layer at least in part by the adhesive in the plurality of cavities, respectively.

2. The device of claim 1, wherein each of the plurality of conductive pads comprise sidewalls in contact with the adhesive.

3. The device of claim 1, wherein each of the plurality of conductive pads comprise sidewalls in contact with the dielectric layer.

4. The device of claim 3, wherein the plurality of cavities comprise doughnut-shaped cavities.

5. The device of claim 3, wherein the cavities comprise cavities of a shape selected from the group consisting of a circle and a polygon surrounding the conductive pads.

6. The device of claim 1, wherein the dielectric layer comprises a passivation layer.

7. The device of claim 1, wherein the plurality of conductive pads comprise redistribution layers (RDLs).

8. The device of claim 1, wherein the plurality of conductors comprise conductors selected from a group consisting of ball grid array (BGA) balls or pillars.

9. The device of claim 1, wherein the adhesive comprises an adhesive selected from a group consisting of resin, silicone, epoxy, room temperature vulcanization (RTV) material, or thermoplastic.

10. The device of claim 1, wherein the plurality of conductors are arranged in a plurality of columns and a plurality of rows on the package.

11. The device of claim 1, wherein a pair of conductive pads of the plurality of conductive pads is disposed within each of the plurality of cavities, wherein a first conductive pad of each pair of conductive pads is disposed on a bottom surface of a cavity of the plurality of cavities, and wherein a second conductive pad of each pair of conductive pads is coupled to a conductor of the plurality of conductors.

12. The device of claim 11, wherein the first and second conductive pads of each pair of conductive pads are conductively coupled together by a via.

13. A device, comprising:
a package;
a dielectric layer having first and second surfaces, the first surface of the dielectric layer disposed on the package, the dielectric layer having a plurality of cavities recessed from the second surface of the dielectric layer and not extending to the first surface of the dielectric layer, each of the plurality of cavities having a bottom surface formed by the dielectric layer;
an adhesive disposed in the plurality of cavities;
a plurality of conductive pads disposed within the dielectric layer, the plurality of conductive pads comprising a plurality of stacked redistribution layers (RDLs), each of the plurality of conductive pads positioned on the bottom surface of a respective one of the plurality of cavities and separated from the package by the dielectric layer; and
a plurality of conductors disposed on the plurality of conductive pads, the plurality of conductors separated from the dielectric layer at least in part by the adhesive in the plurality of cavities, respectively.

14. The device of claim 13, wherein each of the plurality of conductive pads have sidewalls in direct contact with the adhesive.

15. The device of claim 13, wherein each of the plurality of conductive pads have sidewalls in direct contact with the dielectric layer.

16. The device of claim 15, wherein the plurality of cavities comprise doughnut-shaped cavities.

17. The device of claim 13, wherein the plurality of conductors comprise ball grid array (BGA) balls.

18. The device of claim 13, wherein the plurality of conductors are arranged in a plurality of columns and a plurality of rows on the package.

* * * * *